United States Patent
Jiang et al.

(10) Patent No.: US 10,381,403 B1
(45) Date of Patent: Aug. 13, 2019

(54) MRAM DEVICE WITH IMPROVED SEAL RING AND METHOD FOR PRODUCING THE SAME

(71) Applicant: GLOBALFOUNDRIES Singapore Pte. Ltd., Singapore (SG)

(72) Inventors: Yi Jiang, Singapore (SG); Bharat Bhushan, Singapore (SG); Curtis Chun-I Hsieh, Singapore (SG); Mahesh Bhatkar, Singapore (SG); Wanbing Yi, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/014,868

(22) Filed: Jun. 21, 2018

(51) Int. Cl.
*H01L 27/22* (2006.01)
*H01L 43/12* (2006.01)
*H01L 43/02* (2006.01)
*H01L 23/58* (2006.01)

(52) U.S. Cl.
CPC ............ *H01L 27/222* (2013.01); *H01L 43/12* (2013.01); *H01L 23/585* (2013.01); *H01L 43/02* (2013.01)

(58) Field of Classification Search
CPC ....... H01L 27/222; H01L 43/12; H01L 43/02; H01L 23/585
See application file for complete search history.

(56) References Cited

U.S. PATENT DOCUMENTS

| | | | | |
|---|---|---|---|---|
| 6,876,062 B2 * | 4/2005 | Lee | ........................ | H01L 23/562 257/622 |
| 7,202,550 B2 * | 4/2007 | Fu | ......................... | H01L 23/544 257/620 |
| 8,217,394 B2 * | 7/2012 | Yang | ....................... | H01L 22/32 257/48 |
| 8,237,160 B2 * | 8/2012 | Chen | ...................... | H01L 22/34 257/48 |
| 8,334,582 B2 * | 12/2012 | Jeng | ......................... | H01L 21/78 257/620 |
| 8,338,917 B2 * | 12/2012 | Yaung | .................... | H01L 23/585 257/620 |
| 8,436,472 B2 * | 5/2013 | Chen | ...................... | H01L 23/562 257/620 |
| 8,901,714 B2 * | 12/2014 | Yen | ........................ | H01L 23/552 257/409 |
| 9,397,139 B1 * | 7/2016 | Tan | ........................ | H01L 27/222 |
| 9,698,200 B2 * | 7/2017 | Li | ........................... | H01L 27/228 |
| 9,728,474 B1 * | 8/2017 | Yi | ............................ | H01L 22/32 |
| 9,865,649 B2 * | 1/2018 | Tan | ........................ | H01L 27/228 |
| 9,972,775 B2 * | 5/2018 | Shum | ...................... | H01L 43/12 |
| 10,121,964 B2 * | 11/2018 | Tan | ........................ | H01L 43/08 |
| 2006/0055005 A1 * | 3/2006 | Furusawa | ............. | H01L 23/564 257/635 |

(Continued)

*Primary Examiner* — Earl N Taylor
(74) *Attorney, Agent, or Firm* — Ditthavong & Steiner, P.C.

(57) ABSTRACT

A method for forming a MRAM device free of seal ring peeling defect, and the resulting device, are provided. Embodiments include forming magnetic tunnel junction (MTJ) over a metallization layer in a seal ring region of an MRAM device; forming a metal filled via connecting the MTJ and the metallization layer; forming a tunnel junction via over the MTJ; and forming a top electrode over the tunnel junction via.

20 Claims, 4 Drawing Sheets

(56) References Cited

U.S. PATENT DOCUMENTS

| | | | |
|---|---|---|---|
| 2007/0023915 A1* | 2/2007 | Jao | G01R 31/2884 257/758 |
| 2007/0102791 A1* | 5/2007 | Wu | H01L 23/562 257/618 |
| 2008/0191205 A1* | 8/2008 | Tsai | H01L 22/34 257/48 |
| 2008/0277659 A1* | 11/2008 | Hsu | H01L 22/34 257/48 |
| 2009/0001522 A1* | 1/2009 | Wu | H01L 23/562 257/622 |
| 2009/0008750 A1* | 1/2009 | Tokitoh | H01L 23/562 257/629 |
| 2010/0078769 A1* | 4/2010 | West | H01L 23/562 257/620 |
| 2010/0193850 A1* | 8/2010 | Asao | H01L 27/228 257/295 |
| 2011/0115057 A1* | 5/2011 | Harn | G03F 9/7084 257/620 |
| 2011/0241178 A1* | 10/2011 | Miki | H01L 21/6836 257/620 |
| 2012/0175728 A1* | 7/2012 | Yang | H01L 23/564 257/508 |
| 2015/0021727 A1* | 1/2015 | Lloyd | H01L 27/222 257/427 |
| 2016/0254440 A1* | 9/2016 | Wang | H01L 27/222 257/421 |
| 2016/0268336 A1* | 9/2016 | Shum | H01L 43/12 |
| 2016/0351797 A1* | 12/2016 | Yi | H01L 27/228 |
| 2017/0018704 A1* | 1/2017 | Chuang | H01L 27/228 |
| 2017/0069827 A1* | 3/2017 | Lee | H01L 43/08 |
| 2017/0084820 A1* | 3/2017 | Tan | H01L 43/08 |
| 2017/0092693 A1* | 3/2017 | Tan | H01L 27/228 |
| 2017/0104029 A1* | 4/2017 | Li | H01L 27/228 |
| 2018/0182810 A1* | 6/2018 | Yi | H01L 27/224 |

* cited by examiner

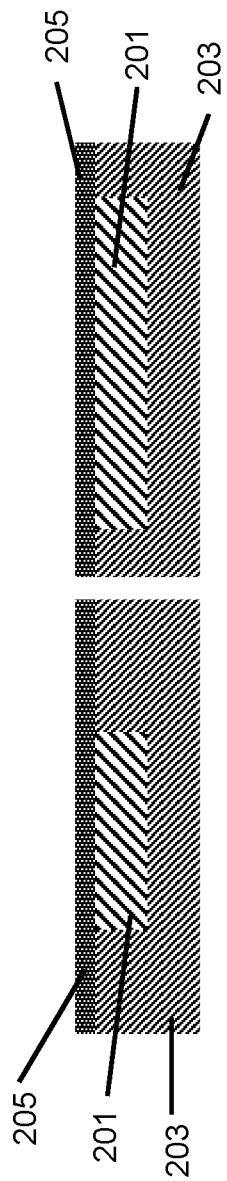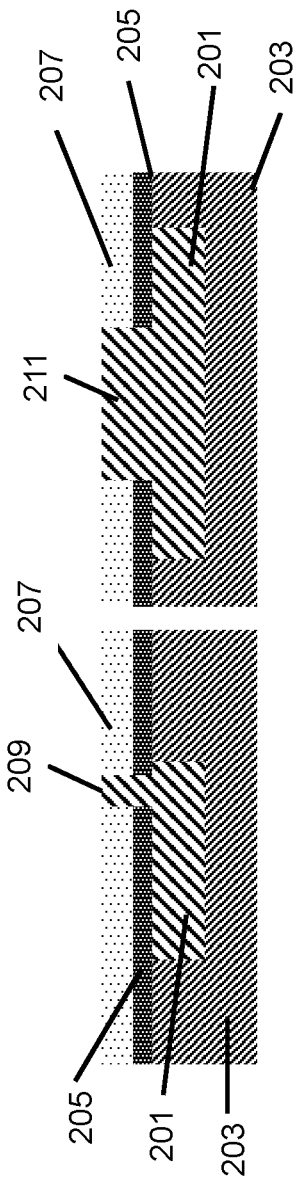
FIG. 2A
FIG. 2B

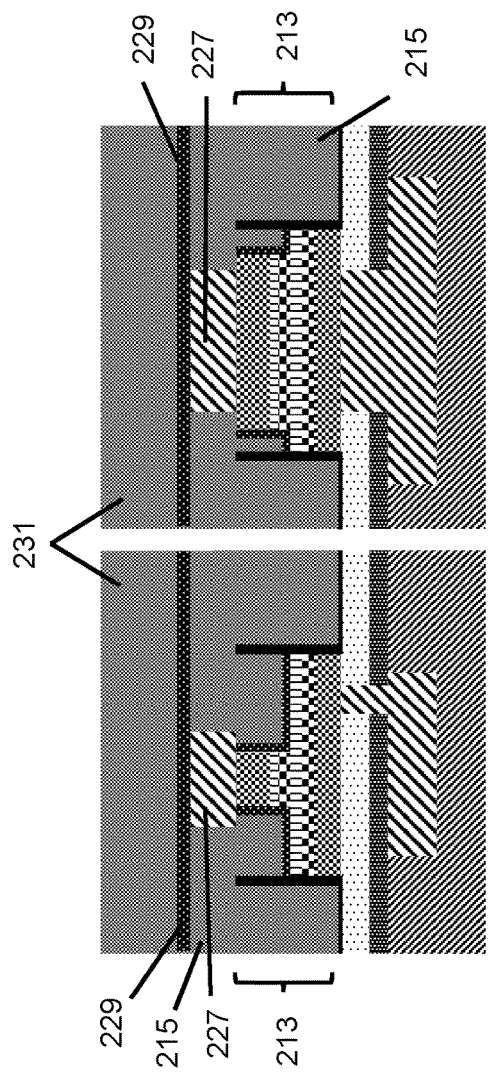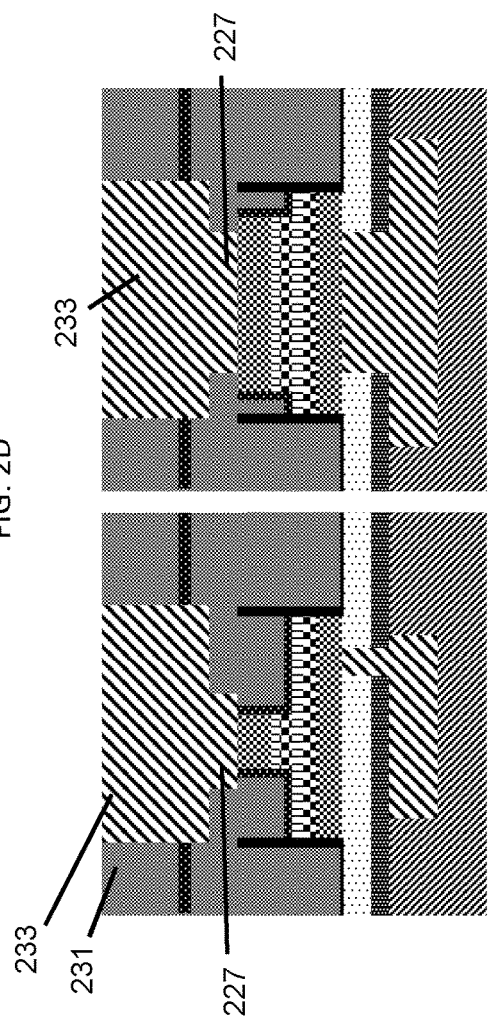
FIG. 2D
FIG. 2E

MRAM DEVICE WITH IMPROVED SEAL RING AND METHOD FOR PRODUCING THE SAME

TECHNICAL FIELD

The present disclosure relates to semiconductor fabrication. In particular, the present disclosure relates to formation of magnetoresistive random-access memory (MRAM).

BACKGROUND

MRAM devices based on spin transfer torque (STT) are popular forms of non-volatile memory due to their low power consumption, high storage capacity and high operational speed. The microprocessor industry continues to advance the goal of smaller, more efficient microprocessors, such as MRAM devices, which are capable of integration within a variety of applications without compromising performance or cost. The memory storage element of a MRAM device is known as a magnetic tunnel junction (MTJ), which is magnetically controlled (switched) to enable a read or write operation.

Unfortunately, the current STT-MRAM devices are subject to seal ring peeling defect due to 2× via (WT) bar punch through to an underlying metallization layer (M3 or M5) at a seal ring area. In FIG. 1, the memory region A and logic region B of a conventional STT-MRAM device is illustrated in cross-section. The M3 layer 101 is formed in a low dielectric constant (low-k) dielectric layer 103 in both the memory region A and logic region B. The WT 105 connects the 2× metal layer (BA) loop 107 to the M3 101 in the seal ring area of logic region B The seal ring enclose the active area. The seal ring structure includes an inner seal ring portion surrounding an integrated circuit region, to protect circuit. In the memory region A, the tunnel junction via 109 connects the BA 107 to the underlying MTJ 111. The WT 105 is formed in a low temperature tetraethyl orthosilicate (TEOS) 113 in the logic region B, and the MTJ 111 is formed in the low temperature TEOS 113 in the memory region A. It is difficult to achieve proper landing at both the seal ring and logic area B from the WT 105 etch tuning due to a significant etch rate difference between the seal ring and logic area B. Seal ring peeling defect 115 is shown due to WT 105 bar punch through to M3 101 at a seal ring area. The punch through etch extends down to the M3 layer 115a.

A need therefore exists for a method for forming a MRAM device which prevents WT etch punch through and seal ring peeling, and the resulting device.

SUMMARY

An aspect of the present disclosure is a method of forming an MRAM device, such as STT-MRAM, ReRAM or FeRAM, without WT punch through or seal ring peeling, and the related device. Aspects include replacing the WT bar design with a MTJ layer in the logic region which solves the seal ring peeling issue due to WT etch punch through to the M3 or M5.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming magnetic tunnel junction (MTJ) over a metallization layer in a seal ring region of an MRAM device; forming a metal filled via connecting the MTJ and the metallization layer; forming a tunnel junction via over the MTJ; and forming a top electrode over the tunnel junction via.

Aspects of the present disclosure include forming the metallization layer in a low dielectric constant (low-k) layer. Another aspect includes forming the metallization layer, the metal filled via and top electrode with copper (Cu). Another aspect includes forming an N-Blok layer over the low-k dielectric layer. Other aspects include forming an oxide layer over the N-Blok layer, wherein the metal filled via extends through the oxide layer and the N-Blok layer. Further aspects include forming the MTJ with at least two ferromagnetic layers separated by an insulating tunnel barrier. Other aspects include forming the metal filled via in the seal ring region with a width greater than a metal filled via in a memory region of the MRAM device. Additional aspects include forming the tunnel junction via in the seal ring region with a width greater than a tunnel junction via in a memory region of the MRAM device. Yet other aspects include the MTJ in the seal ring region being a magnetic shield of an active region in the memory region of the MRAM device.

Still yet, another aspect of the present disclosure includes a device including: a MTJ formed over a metallization layer in a seal ring region of an MRAM device; a metal filled via connecting the MTJ and the metallization layer; a tunnel junction via formed over the MTJ; and a top electrode formed over the tunnel junction via.

Additional aspects include the metallization layer being formed in a low-k dielectric layer. Additional aspects include the metallization layer, the metal filled via and top electrode including Cu. Other aspects include an N-Blok layer being formed over the low-k dielectric layer. Further aspects include an oxide layer formed over the N-Blok layer, wherein the metal filled via extends through the oxide layer and the N-Blok layer. Other aspects include the MTJ including at least two ferromagnetic layers separated by an insulating tunnel barrier. Yet other aspects include the metal filled via being formed in the seal ring region with a width greater than a metal filled via in a memory region of the MRAM device. Further aspects include the tunnel junction being formed via in the seal ring region with a width greater than a tunnel junction via in a memory region of the MRAM device.

Still yet, another aspect of the present invention includes a method including: forming a Cu metallization layer in a dielectric layer in a seal ring region of an STT-MRAM device; forming a MTJ over the metallization layer in seal ring region; forming a Cu filled via connecting the MTJ and the metallization layer; forming a Cu filled tunnel junction via over the MTJ; and forming a top Cu electrode over the tunnel junction via.

Aspects of include forming the tunnel junction via in the seal ring region with a width greater than a tunnel junction via in a memory region of the STT-MRAM device. Another aspect includes the MTJ in the seal ring region being a magnetic shield of an active region in the memory region of the STT-MRAM device.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2E schematically illustrate cross-sectional views of a process flow to produce an MRAM, in accordance with exemplary embodiments.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of seal ring peeling in MRAM devices without requiring a reticle change or adding to cost of manufacture. This problem is solved, inter alia, by replacing the WT bar design with a MTJ layer in the logic region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
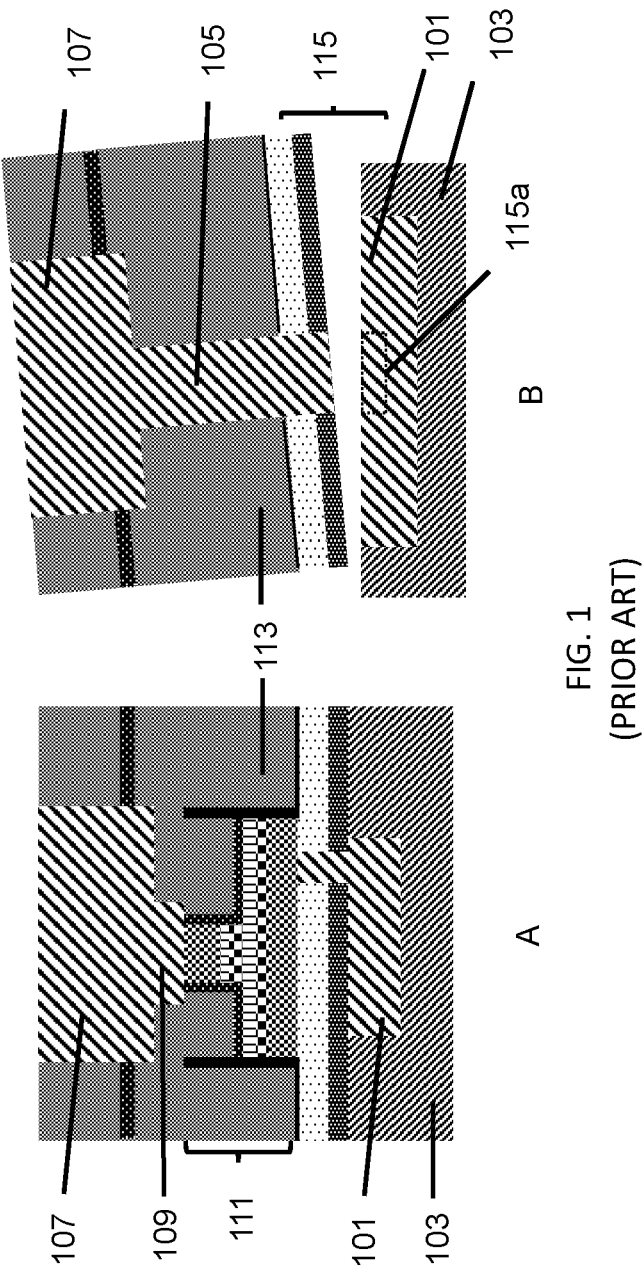
FIG. 1 schematically illustrate cross-sectional views of a conventional STT-MRAM in the 40 nanometer (nm) technology node having a seal ring peeling defect in the logic region.
Figure 2C:
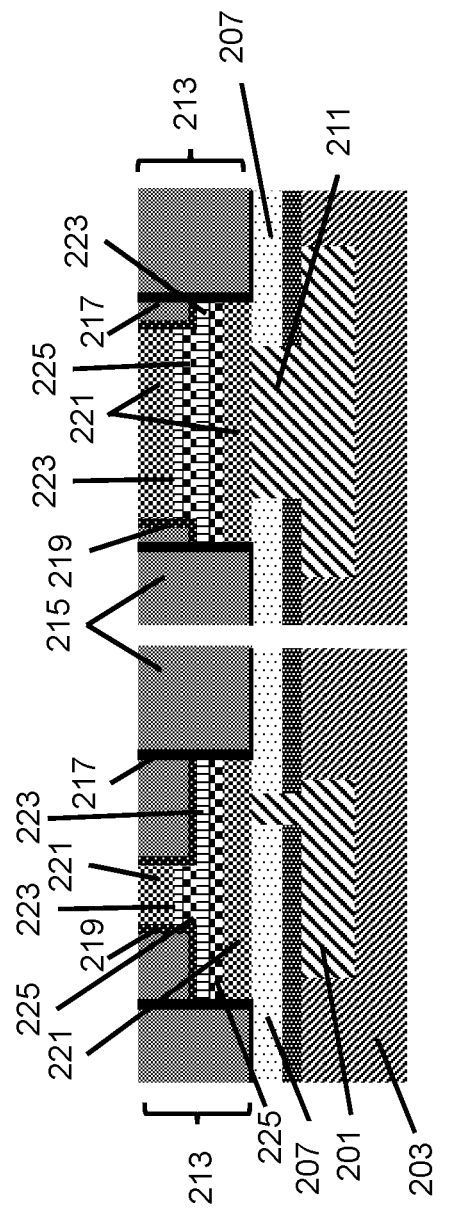

FIGS. 2A through 2E schematically illustrate cross-sectional views of a process flow for forming an MRAM, such as an STT-MRAM, in accordance with exemplary embodiments. The 40 nm MRAM 2× pitch is about 152 nm and the 28/22 nm MRAM 2× pitch is 180 nm. Referring to FIG. 2A, an M3 layer 201 is formed in a low-k dielectric layer 203 (k value of <3.9) in a memory region A and logic region B of the MRAM device. Although not shown, for a 28/22 nm MRAM, a M5 layer formed in an ultra low-k dielectric (k value of <2.5) is intended. The M3 layer is formed of copper (Cu) and formed by way of a dual damascene process. The low-k dielectric layer 203 may be a carbon-doped oxide such as silicon oxide (SiO), silicon dioxide ($SiO_2$), a porous oxide/porous doped oxide or any other known material with a suitable dielectric constant. A silicon-carbon-hydrogen-nitrogen layer 205 (e.g., N-BLoK) is deposited over the low-k dielectric layer 203. The N-Blok layer 205 has a thickness of 20 to 50 nm. The low-k dielectric layer 203 has a thickness of 140 to 220 nm.

In FIG. 2B, an oxide layer 207 is formed over the N-Blok 205 to a thickness of 30 to 50 nm. The oxide layer 207 can include of silicon oxide, TEOS, etc. The Cu filled via 209 extends through the oxide layer 207 and N-Blok layer 205 down to the M3 201 in the memory region A. In the logic region B, Cu filled via 211 extends through the oxide layer 207 and N-Blok layer 205 down to the M3 201. The Cu filled via 211 can have a width of 0.154 to 0.7 μm which is wider than a width of the Cu filled via 209.

In FIG. 2C, the MTJ loop 213 is formed in the memory region A and logic region B in seal ring area. The MTJ 213 is formed as pillars or cells in a low temperature TEOS layer 215, and formed by depositing and etching a MTJ film over the oxide 207 in the memory region A and over the oxide layer 207 in the logic region B. The MTJ 213 in the seal ring area of logic region B has a width larger than a width of the MTJ 213 in the memory region which permits the MTJ 213 to have a full landing on the Cu filled via 211.

The MTJ film includes at least two ferromagnetic layers separated by an insulating tunnel barrier. In this example, the MTJ 213 includes a redeposition layer 217 formed post MTJ etching. The redeposition layer 217 includes tantalum oxide (TaO), which is non-conductive. An encapsulation layer 219 is formed of a nitride layer such as low temperature silicon nitride (SiN). The MTJ 213 includes top and bottom contacts 221 (e.g., TaN), insulating tunnel barrier layer 223 (e.g., MgO) separating two ferromagnetic layers 225 (e.g., CoFeB), which includes about 20 multi-layers. Spacer layers can be formed between the top and bottom contacts 221 and the ferromagnetic layers 225. A chemical mechanical polishing (CMP) step is used to remove excess MTJ 213.

In FIG. 2D, a tunnel junction via 227 is formed in low temperature TEOS layer 215 over the MTJ 213. A SiN hard mask layer 229 is formed to a thickness of 30 to 60 nm. An additional TEOS layer 231 is deposited over the SiN layer 229. In FIG. 2E, a dual damascene process is performed to form a BA loop 233 in the memory region A and logic region B. The Cu filled BA loop extends down to the Cu fill tunnel junction via 227 in the memory region A and logic region B. The seal ring of all die in the logic region serves as magnetic shielding of active area of memory region.

The embodiments of the present disclosure can achieve several technical effects including optimizing the seal ring area of MRAM devices using a MTJ layer instead of a WT bar to prevent seal ring peeling. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAMs, STT-MRAMs, ReRAMs and FeRAMs in the 40 nm and 28/22 nm and beyond technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a magnetic tunnel junction (MTJ) formed over a metallization layer in a seal ring region of an MRAM device;
   a metal filled via connecting the MTJ and the metallization layer;
   a tunnel junction via formed over the MTJ; and
   a top electrode formed over the tunnel junction via.

2. The device according to claim 1, the metallization layer being formed in low dielectric constant (low-k) layer.

3. The device according to claim 1, wherein the metallization layer, the metal filled via and top electrode comprise copper (Cu).

4. The device according to claim 2, further comprising:
   an N-Blok layer formed over the low k layer.

5. The device according to claim 4, further comprising:
   an oxide layer formed over the an N-Blok layer,
   wherein the metal filled via extends through the oxide layer and the N-Blok layer.

6. The device according to claim 1, wherein the MTJ comprises at least two ferromagnetic layers separated by an insulating tunnel barrier.

7. The device according to claim 1, wherein the metal filled via is formed in the seal ring region with a width greater than a metal filled via in a memory region of the MRAM device.

8. The device according to claim 1, wherein the tunnel junction via is formed in the seal ring region with a width greater than a tunnel junction via in a memory region of the MRAM device.

9. A method comprising:
   forming magnetic tunnel junction (MTJ) over a metallization layer in a seal ring region of an MRAM device;
   forming a metal filled via connecting the MTJ and the metallization layer;
   forming a tunnel junction via over the MTJ; and
   forming a top electrode over the tunnel junction via.

10. The method according to claim 9, comprising:
    forming the metallization layer in low dielectric constant (low-k) layer.

11. The method according to claim 9, comprising:
    forming the metallization layer, the metal filled via and top electrode with copper (Cu).

12. The method according to claim 10, further comprising:
    forming an N-Blok layer over the low-k dielectric layer.

13. The method according to claim 12, further comprising:
    forming an oxide layer over the N-Blok layer,
    wherein the metal filled via extends through the oxide layer and the N-Blok layer.

14. The method according to claim 9, further comprising:
    forming the MTJ with at least two ferromagnetic layers separated by an insulating tunnel barrier.

15. The method according to claim 9, comprising:
    forming the metal filled via in the seal ring region with a width greater than a metal filled via in a memory region of the MRAM device.

16. The method according to claim 9, comprising:
    forming the tunnel junction via in the seal ring region with a width greater than a tunnel junction via in a memory region of the MRAM device.

17. The method according to claim 16, wherein the MTJ in the seal ring region is a magnetic shield of an active region in the memory region.

18. A method comprising:
    forming a copper (Cu) metallization layer in a dielectric layer a seal ring region of an STT-MRAM device;
    forming a magnetic tunnel junction (MTJ) over the metallization layer in the seal ring region;
    forming a Cu filled via connecting the MTJ and the metallization layer;
    forming a Cu filled tunnel junction via over the MTJ; and
    forming a top Cu electrode over the tunnel junction via.

19. The method according to claim 18, comprising:
    forming the tunnel junction via in the seal ring region with a width greater than a tunnel junction via in a memory region of the STT-MRAM device.

20. The method according to claim 19, wherein the MTJ in the seal ring region is a magnetic shield of an active region in the memory region of the STT-MRAM device.

* * * * *